United States Patent [19]

Montenieri Sr.

[11] Patent Number: 4,867,210

[45] Date of Patent: Sep. 19, 1989

[54] CABLE JUNCTION SEALANT APPLICATOR

[75] Inventor: Robert E. Montenieri Sr., Southington, Conn.

[73] Assignee: Loctite Corporation, Newington, Conn.

[21] Appl. No.: 109,355

[22] Filed: Oct. 15, 1987

[51] Int. Cl.⁴ .................................................. B65B 3/04
[52] U.S. Cl. ..................................... 141/98; 141/382; 174/76; 401/10
[58] Field of Search ............... 141/382, 383, 387, 389, 141/98; 174/76, 77 R; 156/49, 48; 249/83, 85; 425/116, 117, 113; 401/10; 403/266, 267, 268

[56] References Cited

U.S. PATENT DOCUMENTS

| | | | |
|---|---|---|---|
| 2,955,338 | 10/1960 | Gough | 403/268 |
| 3,233,035 | 2/1966 | Black | 174/76 |
| 3,559,241 | 2/1971 | Chu | 425/113 |
| 3,638,978 | 2/1972 | Guntermann | 403/267 |
| 4,176,245 | 11/1989 | Merlack et al. | 174/76 |
| 4,485,268 | 11/1984 | Kaplan | 174/76 |
| 4,511,279 | 4/1985 | Carpanzano | 403/266 |
| 4,591,330 | 5/1986 | Charlebois et al. | 425/117 |
| 4,648,606 | 3/1987 | Brown et al. | 174/77 R |
| 4,733,019 | 3/1988 | Pichler et al. | 174/77 R |

FOREIGN PATENT DOCUMENTS

1114386  4/1956  France ............................. 403/268

Primary Examiner—Ernest G. Cusick
Assistant Examiner—Edward C. Donovan
Attorney, Agent, or Firm—Steven J. Hultquist

[57] ABSTRACT

A sealant applicator comprising an enclosure body which is openable to receive structure defining a junction locus into its interior space. Means are provided for introducing a flowable sealant into the interior space of the enclosure, e.g., a fill tube open at one end and joined at its opposite end in closed-flow communication with the enclosure body, to deposit sealant material at the junction locus. A sealant application apparatus is also disclosed, comprising a sealant applicator of the aforementioned type, secured to the nozzle of a pressurized container containing the sealant material. The sealant applicator of the invention is particularly useful for applying electromagnetic interference- and RF leakage-blockingly effective sealant materials to cable junctions, e.g., a junction formed by a coaxial cable and a cable television junction box.

19 Claims, 6 Drawing Sheets

CABLE JUNCTION SEALANT APPLICATOR

BACKGROUND OF THE INVENTION

1. Field of the Invention

This invention relates generally to devices for applying sealant to structure defining a junction locus, e.g., the junction of a cable with another cable or a coupling with another member, where sealants are desirably employed to provide environmental protection to the junction, to provide shielding against electromagnetic interference (EMI) and/or radio frequency leakage, etc.

2. Description of The Related Art

In numerous applications where radio frequency (RF) devices are employed, e.g., impedance matching-/coupling devices, ground protection devices (ground fault interruptor systems), radar transmitters and/or receivers, and signal splitting systems, the occurrence of EMI and RF leakage into or out of the device seriously adversely affect its operation for its intended purpose.

As a specific example, in cable television (CATV) systems, RF signals that leak into the ambient environment cause interference with other equipment containing electromagnetic components which operate within the same frequency range, such as aircraft telecommunications and guidance systems. As a consequence, the Federal Communication Commission (FCC) has imposed stringent rules and regulatory sanctions relating to signal leakage from cable systems. Conversely, the RF leakage of stray electromagnetic signals into the cable system is a significant concern, since such leakage causes interference with the transmitted cable signal, resulting in substandard reception by the CATV viewer receiving the transmitted signal at his television or monitor. Such interference resulting from RF leakage is reported to be the single largest maintenance problem facing the CATV industry today.

The main portal of RF signal leakage in CATV systems is loose or corroded couplings on the CATV cables, such as the drop connectors connected to port taps on the tap box in the main co-axial cable line serving an individual CATV subscriber, and the drop connectors connected to the ground block which is attached to the subscriber's building in which the CATV signal is processed for viewing.

General approaches which have evolved for reducing EMI or RF interference include shielding means, such as plate members and housings constructed of materials which absorb radio and other electromagnetic waves.

Such shielding elements are generally useful in attenuating EMI/RF interference in the signal processing portion of the system, but do not solve the problem of EMI or RF leakage associated with the junctions of such signal processing (or generating) units at their connections with external leads, such as electrical cables or wires, nor do they solve the problems associated with line-to-line couplings of the cables or wires which transmit electromagnetic signals into or out of the signal processing unit.

In some systems, "rubber boots" have been utilized over the couplings joining signal processing units and their external leads, to eliminate or substantially reduce EMI and RF leakage at such junctions. Such boots are similar in design to covers used in automotive systems for spark plug connector wires, and generally work well initially when properly fitted to cover the associated coupling.

Nonetheless, such rubber boots due to their generally high coefficient of friction on the interior surfaces mating with the coupling, frequently tend to be poorly installed, so that they incompletely cover the coupling, and allow EMI and RF leakage to adversely affect the operation of the system.

Further, where the system is subject in operation to vibration, translation, flexural stresses on the leads and/or signal processing unit, etc., the couplings even when overlaid with rubber boots tend to loosen, and thereby increase the susceptibility of the system to EMI and RF leakage.

In addition, when electromagnetic devices are employed in exterior environments, corrosion of couplings and associated elements of the system may result from the presence of atmospheric moisture. The corrosion may be accelerated by the presence of dissimilar metals in the couplings or adjacent portions of the system, with consequent adverse affect on the structural integrity as well as the performance characteristics of the system.

Such corrosive action is facilitated by poorly fitted or loosened boots. Although it is known in the art to coat couplings and the interior surfaces of boots employed thereover with silicone greases to serve as moisture permeation barriers, such greases dry out and crack or otherwise dissipate in use, so that their anti-corrosive efficacy is lost.

The foregoing problems are particularly severe in CATV junction boxes, which are typically employed in exterior environments on overhead or underground signal cables, and have a plurality of couplings joining the box to the signal cable and the service (output) cables. In such environments, the junction box/cable couplings readily tend to work loose, as well as corrode.

In co-pending U.S. application Ser. No. 07/003,873 filed Jan. 16, 1987 in the name of James P. Moran, Jr., there is disclosed a means for protecting the junction of signal processing means and electromagnetic transmission means from adverse operating effects such as EMI/signal loss, signal attenuation, and RF leakage, by disposing at the junction of the signal processing means and the electromagnetic transmission means a layer of a material which is blockingly effective against such adverse operating effects. The blockingly effective material has a volumetric resistivity of from about $10^{-3}$ to about 2,000 ohm-centimeters.

Specifically, the blockingly effective material disclosed in this patent application may comprise a binder, such as a nylon, rubber, or halogenated vinyl polymer, and an electrically conductive component, such as carbon, aluminum, nickel, copper, or silver, dispersed in the binder. A particularly preferred composition of such type is disclosed as comprising an ethylene-butylene-styrene block copolymer, commercially available from Shell Chemical Company as KRATON ® G.1650, and 15% by weight, based on the dry solids of the formulation, of a conductive carbon powder having an average surface area (BET) of 2.54 meters$^2$/gram, in 1,1,-trichlorothane solvent solution.

This application further discloses that the solvent-based formulation described above may be applied to the junction locus of the electromagnetic device by dispensing the formulation in a non-aerated form from a pressurized container equipped with a nozzle which when manually pressed off-center, causes a rapid flow of the formulation in a non-aerated condition to be dispensed onto the cable junction.

The pressurized container dispensing of sealant materials onto the cable junction, as disclosed in the above-described Moran, Jr. patent application, is highly effective in reducing EMI and RF leakage effects to a virtually negligible level when the sealant composition is fully circumferentially applied to the cable junction.

Unfortunately, however, as already described, the CATV system frequently comprises an above-ground cable network with the cable being suspended on poles or otherwise disposed in an overhead position. It is then necessary for the installer or maintenance person to physically secure himself on the pole or structure from which the cable and cable junction box are suspended, and to apply the sealant material. In such position, it is frequently difficult to insure a circumferentially continuous sealing mass on the cable junction, particularly in inclement or windy weather conditions. As a result, the applied sealant is not continuous over the full areal extent of the coupling or junction locus, and this in turn provides a path for EMI and RF leakage, which the applied sealant is intended to eliminate or substantially reduce.

Accordingly, it would be a significant advance in the art to provide a means for applying a sealant material to a junction locus, such as a cable connection, which results in a circumferentially continuous coating of the sealing material over the full areal extent of the junction locus.

It is therefore an object of the present invention to provide a means for applying sealant material to a junction locus so that the resulting sealant coating is circumferentially continuous and covers the fully areal extent of the locus of the junction.

It is a further object of the invention to provide means of such type which are quickly and conveniently employed even in junction locations which are difficult to physically access, e.g., overhead CATV junction box fittings to which signal transmission cables are joined.

It is a further object of the invention to provide a sealant application means of such type, which may be readily manufactured at comparatively low cost.

Other objects and advantages of the invention will be more fully apparent from the ensuing disclosure and appended claims.

SUMMARY OF THE INVENTION

The present invention relates generally to a sealant applicator comprising an enclosure body into which the structure defining the junction locus can be introduced, such as by a hinged portion, or selectively openable and reclosable seam therein, so that the enclosure body is disposed enclosingly around the structure defining the junction locus in spaced relationship thereto, and means for introducing a flowable sealant into the space between the enclosure body and the junction locus-defining structure, to seal the junction locus.

The sealant device may be of a type which is adapted to remain in place permanently at the junction locus, e.g., to provide an enhanced environmental protection, and/or a barrier to EMI and RF signal leakage at the junction.

Alternatively, the enclosure body of the applicator may be configured with a hinge or seam which is opened by manual exertion of force to "wings" or handles attached to the enclosure body, the enclosure body being formed of a flexible resilient material which results in closure of the hinge joint or seam upon release of such manual pressure.

In one embodiment, the applicator device may comprise the enclosure body joined in flow communication with a fill tube which is secured to a pressurized container containing the sealant material, to provide a unitary sealant applicator apparatus.

Other aspects and features of the invention will be more fully apparent from the ensuing disclosure and appended claims.

DETAILED DESCRIPTION OF THE INVENTION, AND PREFERRED EMBODIMENTS THEREOF.

The sealant application means of the present invention may be advantageously employed to apply an EMI and RF leakage-blockingly effective material, or other barrier or functional material, to a structure defining a junction locus, e.g., the locus of the joining of a cable with another member, such as for example another cable, wire, or lead, or coupling adapter means, plug, prong, etc.

More particularly, the applicator of the present invention may be employed with a junction between respective signal processing means or signal transmission means, as well as with junctions of signal processing means with electromagnetic transmission means, wherein the junctions of these respective means are latently susceptible to adverse operating effects associated with EMI, and RF leakage (either into or out of the system formed by the respective signal processing and/or transmission means), signal loss or attenuation due to poor joining of these respective means, etc.

Illustrative devices comprising or having associated therewith junctions of a type to which the applicator of the invention may be used to apply a sealing material, include: impedance matching devices; impedance coupling devices; ground protection (e.g., ground fault interruptor)devices; radar transceivers, such term being understood to include radar transmitters, detectors, and receivers, as well as assemblies combining one or more of such devices; signal splitters; and the like.

The signal processing means referred to in the preceding discussion is intended to be broadly construed to include any suitable means for processing a signal, whether electromagnetic, optical, or otherwise, which is connectable to external leads (electromagnetic transmission means), thereby forming a junction which is latently susceptible to the adverse operating effects described above.

The electromagnetic transmission means referred to in the preceding discussion is likewise intended to be broadly construed to include any suitable means for transmitting an electromagnetic signal to and/or from a signal processing means associated therewith, e.g., wires, cables, waveguides, etc.

A preferred application area for the means of the present invention is cable television junction boxes as radio frequency devices to which EMI/RF leakage blocking layers of sealant may advantageously be applied by the means of the invention.

In the case of CATV junction boxes, the signal processing means comprises electrical circuitry disposed in a housing, the electromagnetic transmission means comprise electrical cable(s), and the junction of the signal processing means to the electromagnetic transmission means comprises respective interlocking mechanical couplings on the housing and end (s) of the associated cable(s).

Thus, the means of the present invention may be used at any suitably configured junction locus to apply a sealant which is blockingly effective against EMI and RF leakage to a junction which is latently susceptible in operation to EMI and RF leakage. Sealants of various types may also be applied to provide a barrier coating, anti-corrosion layers, etc., to the junction structure.

The sealant material which is applied by the applicator means of the present invention therefore may include any suitable sealant or potting composition which is capable of protecting the junction against environmental damage or degradation, or the occurance of adverse operating effects in use, such as a sealant which provides a desired extent of EMI and RF leakage blocking efficacy.

Accordingly, while the ensuing disclosure is primarily in terms of EMI and RF leakage blockingly effective compositions, it will be appreciated that the utility of the invention is not thus limited, and extends to the application of any other sealant material which may be advantageously employed at a junction of physical elements.

In CATV junction box applications, and other EMI and RF leakage susceptible junctions, useful sealant materials may suitably include the compositions illustratively described in copending U.S. patent application Ser. No. 07/003,873 filed Jan. 16, 1987 in the name of James P. Moran, Jr. and issued Mar. 29, 1988 as U.S. Pat. No. 4,734,541, entitled "RADIO FREQUENCY DEVICE UTILIZING EMI-BLOCKING COATING AT CONNECTION WITH EXTERNAL LEADS," the disclosure of which hereby is incorporated by reference herein. As described in such a patent, the EMI/RF blockingly effective composition may suitably comprise a binder, such as a nylon, rubber, or halogenated vinyl polymer, and an electrically conductive component, such as carbon, aluminum, nickel, copper, or silver, dispersed in the binder. The composition suitably may have a volumetric resistivity of from about $10^{-3}$ to about 2,000 ohm-centimeters to provide a high degree of EMI and RF leakage attenuation.

Figures 1, 2:
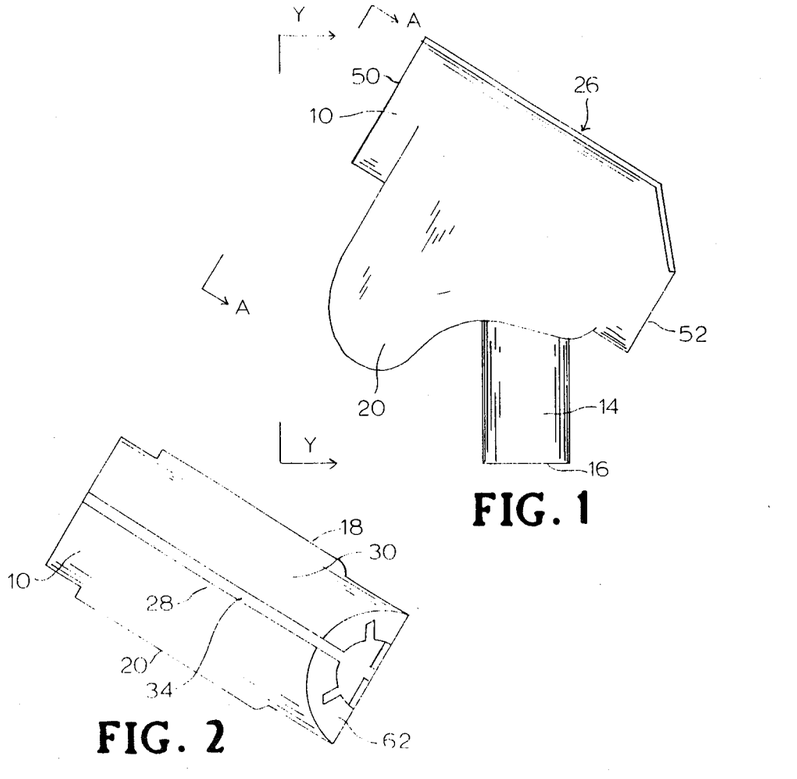
FIG. 1 is a side elevation view of a sealant applicator according to the present invention, in one embodiment thereof.
FIG. 2 is a top plan view of the FIG. 1 sealant applicator, showing the seam opening construction thereof.
Figure 3:
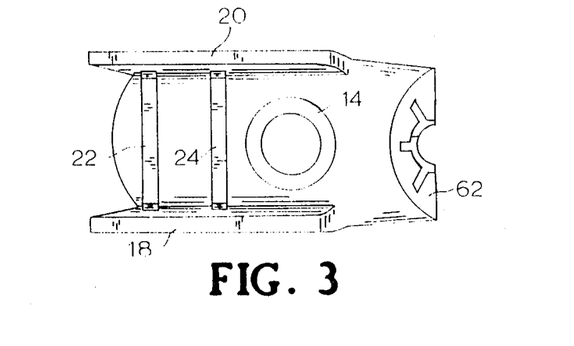
FIG. 3 is a bottom plan view of the sealant applicator of FIG. 1.
Figure 4:
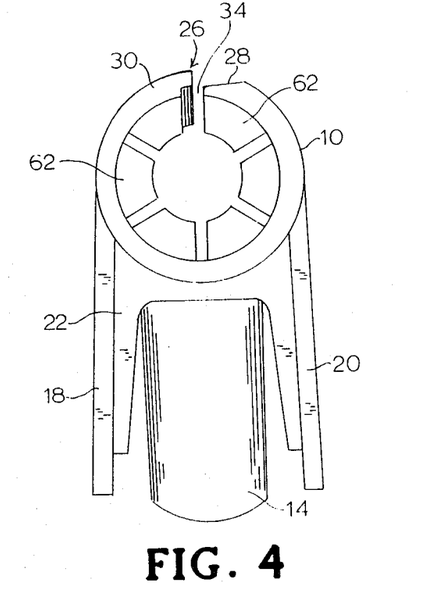
FIG. 4 is a front perspective view of the FIG. 1 applicator, taken along line A—A of FIG. 1, the applicator being positioned so that the axis of the cylindrical body thereof is perpendicular to the plane of the page.
Figure 5:
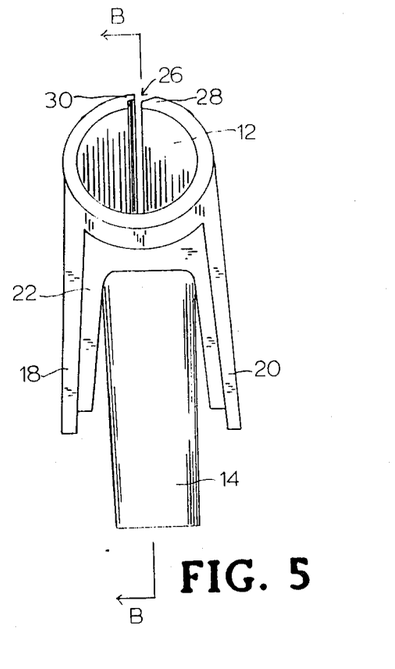
FIG. 5 is a front perspective view of the FIG. 1 applicator, taken along line Y—Y of FIG. 1, the applicator being positioned so that the center axis of the feed tube is parallel to the plane of the page.
Figure 6:
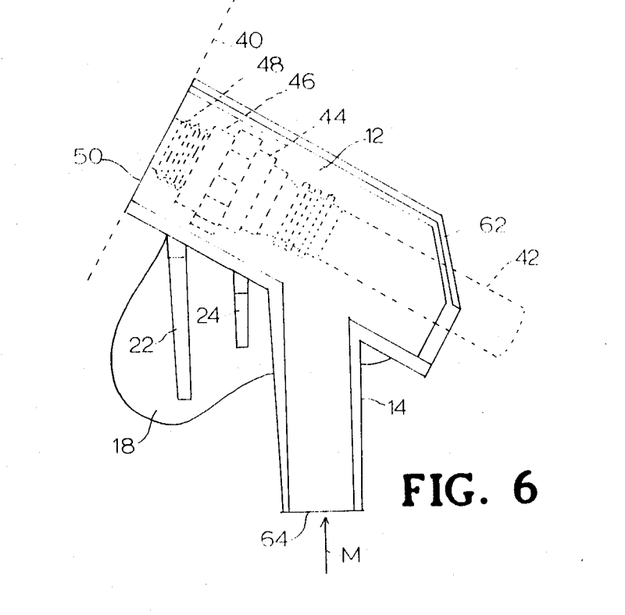
FIG. 6 is a side sectional elevation view of the applicator as shown in FIG. 5, taken along line B—B thereof, and showing the applicator reposed at the junction of a coaxial cable and a junction box surface.

Referring now to the drawings, FIG. 1 shows a side elevation view of a sealant applicator device according to one embodiment of the present invention. Corresponding top plan and bottom plan views are shown in FIGS. 2 and 3, while FIGS. 4 and 5 are frontal elevation views of the device from different perspectives (FIG. 4 being taken along line A—A of FIG. 1, and FIG. 5 being taken along line Y—Y of FIG. 1), while FIG. 6 is a sectional elevation view of the applicator device, taken along line B—B of FIG. 5 and showing, in dotted line representation, the junction of a coaxial cable with a threaded mechanical connector of a CATV junction box. The same reference numerals are used for corresponding elements of the device in all of these views of FIGS. 1-6, as described below.

The sealant applicator device of FIGS. 1-6 comprises a cylindrical body 10 to which is joined in closed flow communication with its interior space 12, a fill tube 14. The fill tube is open at one end 16 and is joined at its opposite end to the cylindrical body, so that sealing material introduced into the fill tube under pressure will flow therethrough into the interior space 12 of the cylindrical body, as hereinafter more fully described.

Joined to the cylindrical body 10 are a pair of manually grippable handles 18 and 20, which in the embodiment illustrated in FIGS. 1-6 are integrally formed with the cylindrical body and fill tube of the applicator. The respective handles are interconnectingly supported by the U-shaped support members 22 and 24, whose purpose is to stiffen and reinforce the applicator structure, so that the seam portion thereof may suitably be biased in a normally closed position to effect sealing of the cylindrical body.

Running longitudinally along the top surface of the cylindrical body 10 is a seam joint 26 formed by circumferentially overlapping portions of the cylindrical body wall defining a tongue wall segment 28 and a groove wall segment 30, as shown, having a longitudinally extending seam opening 34 therebetween when the respective handles 18 and 20 are manually gripped and manual pressure exerted on the handle faces to open the normally closed seam.

Thus, when the applicator device is, for example, held with a thumb on the handle 18 and forefinger on the handle 20, and the respective handle faces are squeezed together, there will result a widening of the longitudinal seam opening 34, until a sufficient lateral opening dimension is achieved whereby the cable junction or other structure defining the junction locus to be sealed is capable of being introduced into the interior space 12 of the cylindrical body 10.

It will be apparent from the foregoing description that the applicator embodiment shown in FIGS. 1–6 is highly efficiently adapted to be reclosably opened to receive a cable or portion of a continuous structure which otherwise may be difficult to enclose, for the purpose of introducing a sealing mass of material around the enclosed structure.

The cylindrically-shaped enclosure body is suitably formed of a flexible resilient material which after being opened in the manner described, and having the cable or other junction element introduced into its interior space, may upon release of the pressure on the respective handles, return to a closed configuration, i.e., with the tongue wall segment 28 reposing in the groove of the groove wall segment 30. Any suitable material of construction meeting such criteria, viz., being selectively deformable to open a longitudinally continuous seam in a wall portion thereof upon application of tension to the wall segments bounding the seam, and after relaxation or release of such tensional force rapidly returning to a closed position where the respective wall segments defining the seam are in abutting contact with one another to effectively seal the seam against egress of sealing material introduced under pressure into the interior space 12 of the cylindrical body, may be employed.

A preferred material of construction for the cylindrical body, and remaining portions of the applicator as well, when the applicator device is unitarily molded or otherwise integrally formed, is polypropylene, although any other "fast memory" material which resiliently returns to its original position rapidly after deformation, e.g., rubberized epoxies, elastomeric biopolymers, flexible fiber-reinforced resin composites, copolymers of ethylenically unsaturated monomers and rubbers forming multiblock polymeric backbone structures, and the like, may be useful in the broad practice of the invention.

The applicator as shown in FIGS. 1–6 is particularly suited for applying a sealing composition to the junction of a coaxial cable and CATV junction box, as shown in FIG. 6, where the junction box 40 and the coaxial cable 42 are shown in dotted line representation, with the junction 44 therebetween comprising the coaxial cable connector 46 which is complementarily threaded on its interior surface with the threading on the junction box connector 48. Thus, the proximal end 50 of the cylindrical body of the applicator is positioned in abutting relationship to the surface of the CATV junction box 40 on which the connector 48 is disposed, so that a leak-tight relationship is established between the CATV junction box 40 and the proximal end 50 of the cylindrical body 10. At the distal end 52 of the cylindrical body 10 (see FIGS. 2, 3, 4, and 6), there is provided a series of circumferentially spaced-apart, annular arcuate-shaped segments 62, which serve to seal the distal end of the cylindrical body around the cable to prevent egress of sealant material. Thus, the central circular area defined by the inner arcuate surfaces of the segments 62 is slightly smaller than the diameter of the cable 42 to be sealed, so that the respective segments bear compressively against the cable in close proximity to one another to enclose the interior space 12 of the cylindrical body at the distal end, and contain the sealant introduced thereinto. As shown in FIG. 4, the segment associated with the tongue wall portion 28 may laterally overlap a corresponding segment associated with the groove wall portion 30, so that the seam is appropriately sealed, along its full longitudinal extent.

When the applicator has been opened at its seam 26 by manual compression (squeezing) of the respective handles 18 and 20, and the cylindrical body 10 has been enclosingly positioned about the junction, the compressive force on the handles is released to close the seam, and a sealant is introduced at the open end 64 of the feed tube. The sealant flows through the feed tube in the direction indicated by arrow M, from which it enters the interior space 12 of the cylindrical body 10 and, being introduced under suitable pressure, fills the interior space to provide a circumferentially and longitudinally continuous coating of the sealant over the junction locus, i.e., so that the junction locus is continuously covered with the sealant over its full areal extent. As indicated, the sealant employed in connection with the applicator of the invention may be of any suitable type which is effective to provide the requisite environmental protection or other barrier or functional properties, e.g., EMI and RF leakage blocking characteristics. Preferably, the material is of a type which is rapidly curing in character, so that the desired end use properties are quickly developed by the sealant composition.

Following the introduction under pressure of a suitable sealant material into the interior space 12 of the sealant applicator, the nozzle or other feed structure which is used to introduce the sealant into the feed tube 14 may be withdrawn. Subsequently, the applicator may be left in place, whereby it acts to provide a further enhancement of the protective ability of the coating, or alternatively, the applicator may be removed, by applying manual pressure to the respective handles 18 and 20 to again open the seam on the cylindrical body of the applicator to a desired extent allowing the sealant-coated junction to pass through the resulting laterally extended opening 34 formed upon compression of the handles and attendant circumferential spreading of the respective tongue wall segment 28 and groove wall segment 30. After such removal, the applicator may be employed to apply sealant to other junction loci.

Figure 7:
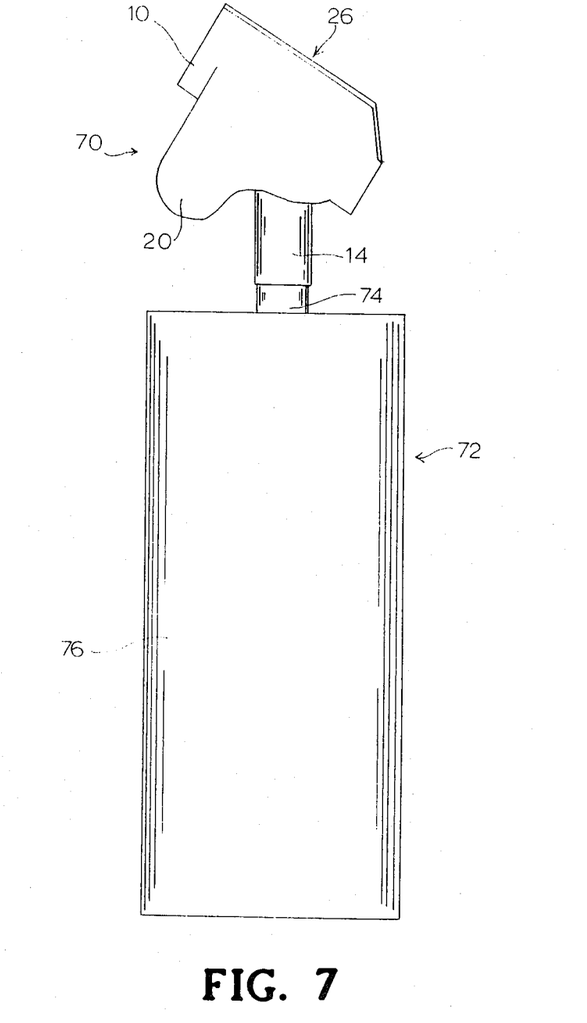
FIG. 7 is an elevational view of a sealing apparatus according to the present invention, in one embodiment thereof, comprising a container of pressurized sealant material and an applicator device of the type shown in FIG. 1 secured to the nozzle of the container.

As an alternative to the use of a separate sealant applicator device and pressurized sealant supply means, the unitary apparatus shown in FIG. 7 may be employed, wherein the sealant applicator 70, of the same general type as shown in FIGS. 1-6, is mounted on the container 72, with the feed tube 14 of the applicator being secured to the nozzle 74 of the container.

The container 72, comprising receptacle 76, to which the aforementioned nozzle 74 is joined, is preferably of a type wherein the sealant material may be contained in a pressurized condition for dispensing in a non-aerated form. A preferred container for such purpose is the dispensing container manufactured by Lechner AG and commercially available as Lechner 10 Barrier Pack, as packaged by Aerosol Systems, Inc. (Cleveland, Ohio). This container features an internal collapsible aluminum tube filled with the contained formulation, and surrounded by a pressurized propellant in an outer shell, with the aluminum tube communicating with the dispensing nozzle 74. Dispensing is effected by manually pressing the nozzle 74 off-center, causing a rapid flow of the formulation from the receptacle 76, in a non-aerated condition.

The specific configuration of the applicator/sealant container shown in FIG. 7 is highly advantageously employed in the application of EMI/RF blockingly effective sealants to overhead cable junctions, since the sealing operation may be carried out in its entirety with only one hand, whereby the other hand may be employed by the service person for securing his or her physical position, or for other purposes.

As indicated, the sealant material may be widely varied in composition. In some instances, in order to enhance the effectiveness of the resulting seal, it may be desirable to incorporate in the sealant composition one or more anti-corrosion additives, e.g., chromium or zinc fillers, such as in application of sealants in coastal areas where the ambient environment is highly corrosive in character.

It may also be advantageous in some applications to enhance the sealing ability of the sealant material by incorporating therein adhesion promotors, flux components, and the like. Depending on the viscosity characteristics of the material, there will be wetting action on the coupling fittings, and capillarity affects may draw some of the sealant material into adjacent threads within the coupled fittings, in junction loci comprising threaded connectors. Accordingly, it may be desirable to include constituents in the material which provide threadlocking of the coupled threads at the junction to be sealed.

It will be further appreciated that any suitable additives may be employed in the sealant composition which do not adversely affect the utility of the material for its intended purpose. By way of illustration, useful additives of such type may include antioxidants, UV stabilizers, pigments, fillers, surfactants, flow-improving agents, etc.

In instances where the sealant layer is formed at the junction from a precursor composition, e.g., a monomer or prepolymer, or with another component which is co-reacted with the composition subsequent to its application to the junction, to yield a film-forming reaction product as the material of the sealant layer, it may likewise be desirable to include various suitable additives in the precursor composition, such as polymerization initiators, accelerators, chain extenders, reactive diluents, inhibitors, etc.

Figure 8:
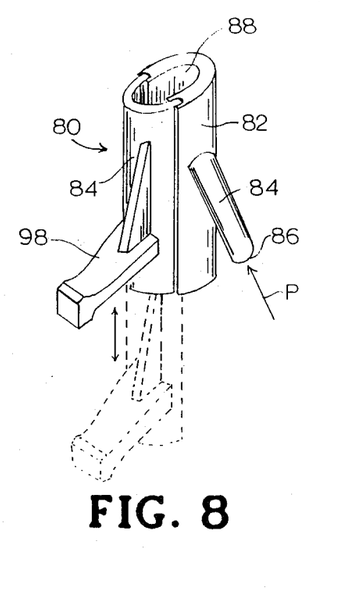
FIG. 8 is a perspective view of a sealant device according to the invention, in another embodiment thereof.
Figure 9:
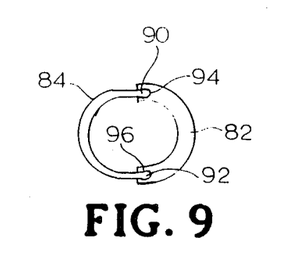
FIG. 9 is a top plan view of the cylindrical body of the applicator of FIG. 8.

FIG. 8 is a perspective view of another embodiment of the invention, with the corresponding plan view of the applicator being shown in FIG. 9. The applicator 80 is fabricated in two respective facing sections, a first section 82 to which is joined a fill tube 84. The fill tube is open at one end 86, to accommodate the introduction of a sealant material thereinto, as flowed in the direction indicated by arrow P. The so-introduced sealant flows through the fill tube 84 into the interior space 88 which is formed between the first section 82 and the facing section 84.

Section 84, as shown in FIG. 9, features at its extremities enlarged edges 90 and 92, which mate cooperatively with corresponding grooves 94 and 96, respectively, in the first section 82.

The facing section of the applicator is provided on its exterior surface with a manually grippable handle 98 which is shaped to be engaged between the thumb and forefinger of a fabrication or maintenance person, and slidingly engaged on its edge surfaces 90 and 92 with the complementarily mating grooves 94 and 96 on the first section of the applicator. Thus, the applicator may be disassembled, by downwardly translating the facing section 84 relative to the first section 82, as indicated in dotted line representation in FIG. 8, whereby two distinct separated sections are obtained. The first section 82 then may be positioned to partially enclose the junction to be sealed, following which the facing section 84 is slidingly engaged with the first section to complete the applicator, as shown.

Figure 10:
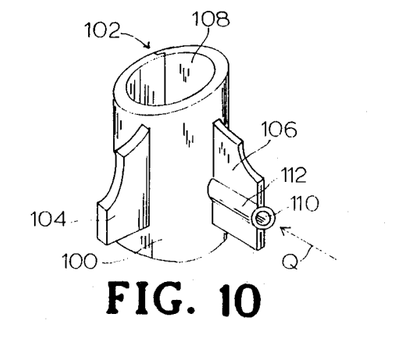
FIG. 10 is a sealant applicator according to another embodiment of the present invention, featuring sealant injection means associated with handles mounted on the cylindrical body.

FIG. 10 shows a perspective view of another applicator embodiment according to the present invention, comprising a cylindrical body 100 having a longitudinally extending seam 102 extending along a portion of the wall thereof. The cylindrical body has on its outer surface, in circumferentially spaced-apart relationship to one another, respective manually grippable handles 104 and 106, which may be integrally formed with the cylindrical body 100, or else separately formed and subsequently joined to the cylindrical body by any suitable means, such as mechanical fasteners, glues, adhesives, bonding media, solvent welding, ultrasonic bonding, etc. Thus, the respective handles 104 and 106 may be manually gripped on their respective outermost faces, e.g., between the thumb and forefinger of a user, to exert compression on the handles and thereby laterally spread apart the adjacent wall segments of the cylindrical body bounding the longitudinal seam 102. In such manner, the junction structure may be introduced into the interior space 108 of the applicator, and the compressive force on the handles subsequently released, whereby the cylindrical body, formed of a suitable flexible resilient material as previously described, returns to its original closed position.

Thereupon, a suitable source of sealant material under pressure is joined in closed flow communication with the inlet opening 110 of the fill tube 112, to flow sealant material therethrough in the direction indicated by arrow Q, into the interior space 108 of the cylindrical body 100, it being understood that the interior passage of the fill tube is in closed flow communication with the interior space 108 of the applicator.

Figure 11:
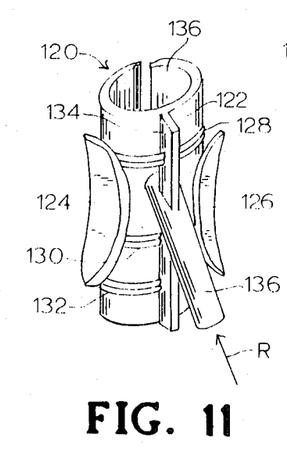
FIG. 11 is a sealant applicator according to another embodiment of the invention.
Figure 12:
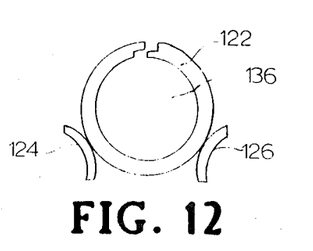
FIG. 12 is a top plan view of the cylindrical body and finger grips of the FIG. 11 applicator.

FIG. 11 is a perspective view of an applicator device according to another embodiment of the invention. The top plan view of the device, with the fill tube and associated structural elements being deleted for simplicity, is shown in FIG. 12. The sealant applicator 120 comprises a cylindrical body 122 having mounted thereon circumferentially spaced-apart, longitudinally coextensive finger grips 124 and 126.

The cylindrical body 122 is reinforced at longitudinally spaced-apart intervals along its length by the circumferentially encircling ribs 128, 130, and 132. Associated with such ribs is a longitudinally extending support 134, which reinforces and provides support for the fill tube 136 joined in closed flow communication with the interior space 138 of the cylindrical body 122. The fill tube is oriented at an angle to the axis of the cylindrical body, as shown, whereby a pressurized source of sealant material may be introduced to the fill tube for flow therethrough in the direction indicated by arrow R, to fill the interior space 136 surrounding the junction locus to be sealed.

Figure 13:
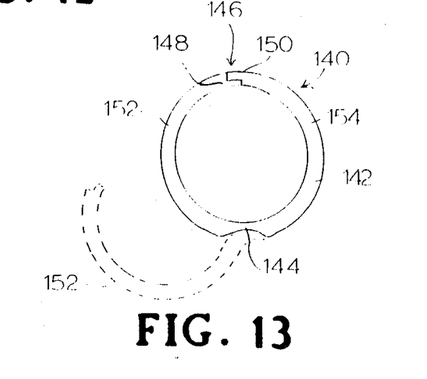
FIG. 13 is a top plan view of a cylindrical body useful in the general practice of the invention, utilizing a "living hinge" construction which permits wide separation of constituents portions of the cylindrical body.

FIG. 13 shows a top plan view of a sealant applicator 140 comprising a cylindrical body 142 having a reduced thickness hinge 144 diametrically opposite the seam opening 146 formed by adjacent interlocking wall portions 148 and 150. Each of these interlocking wall portions of the cylindrical body features tongue and groove surfaces which interfit in the manner shown.

The hinge 144 is highly flexible in character, permitting the cylindrical body 142 to be opened, as shown in dotted line representation. Thus, the left-hand wall section 152 as illustrated is openably swingable away from the opposite wall section 154 to permit the cylindrical body to be wrapped around the junction locus to be sealed, in radially spaced relationship thereto, to provide an annular "fill space" for deposition of the sealant material.

Figure 14:
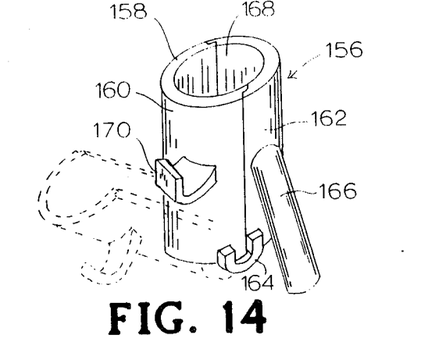
FIG. 14 is still another embodiment of the sealant applicator of the invention.

FIG. 14 shows a sealant applicator 156 comprising a cylindrical body 158 comprising opposed cylindrical body half-sections 160 and 162, joined to one another by hinge 164 at their lower abutting extremities. Each half-section of the cylindrical body is provided on its longitudinal edge surfaces with a tongue and groove configuration of matable surfaces, whereby the respective half-sections may be lockingly mated with one another.

On the right-hand half-section 162 as illustrated is mounted a fill tube 166, having an open passage therein (not shown) by which sealant material under pressure may be flowed, in the direction indicated by arrow S, into the interior space 168 of the sealant applicator.

The left-hand half-section 160 of the cylindrical body as illustrated, is provided on its external surface with a manually grippable handle 170, by means of which the cylindrical body may be opened, and the half-section 160 swung outwardly and downwardly from half-section 162. When half-section 160 is swung completely downwardly open, the cylindrical body is reposable on a cable or other continuous junction locus, following which the half-section 160 is swingable upwardly toward the half-section 162 for mating engagement therewith, whereby the junction locus is enclosed in the cylindrical body, being reposed within the interior space 168 thereof.

Figure 15:
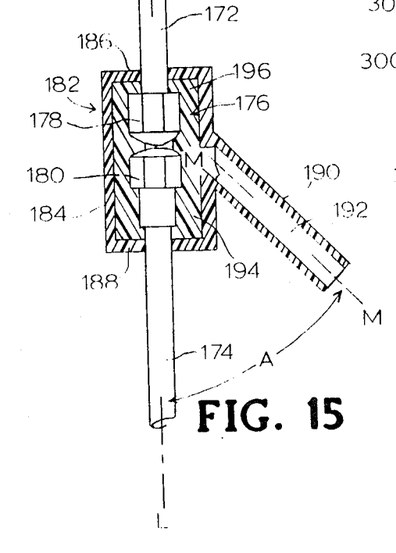
FIG. 15 is a view, in partial section, of a cable junction surrounded by a sealant applicator according to the present invention containing a sealant mass which is circumferentially continuous on the cable junction and which fills the interior volume of the cylindrical body of the sealant applicator.

FIG. 15 shows a junction locus of successive cable segments 172 and 174, joined at the junction locus 176 by interconnection of the respective coupling fittings 178 and 180.

Also illustrated is a sealant applicator 182, as shown in sectional view, comprising an enclosure body 184, which may be of cylindrical, or of non-cylindrical, e.g., elongated box-like, shape, as desired, closed at its respective ends by the walls 186 and 188, and joined in closed flow communication with the fill tube 190. The fill tube has an open passage 192 therein for flow of sealant material under pressure therethrough into the interior space 194 of the enclosure body 184.

A mass of sealant 196 is disposed in the interior space 194 of the cylindrical body, filling the interior space throughout its entire volume, to seal the junction 176 over its entire areal extent.

As shown in the previous embodiments, the fill tube may be disposed at an angle to the central axis of the cylindrical body of the sealant applicator. Alternatively, the fill tube may be oriented substantially perpendicularly to the central axis of the applicator cylindrical body, as shown in the embodiment of FIG. 10. With reference to FIG. 15, the included angle A between the central axis L—L of the cylindrical body and the central axis M—M of the fill tube may be varied widely. In overhead junction locus applications, such as pole-supported CATV cables, and the like, it is preferred that the included angle A be from about 20° to about 80°, and most preferably from about 30° to about 60°. Such preferred acute angle orientation of the fill tube is desirable to facilitate ease of coupling the pressurized sealant source means with the applicator, e.g., by insertion of a pressurized container nozzle into the fill tube.

Figure 16:
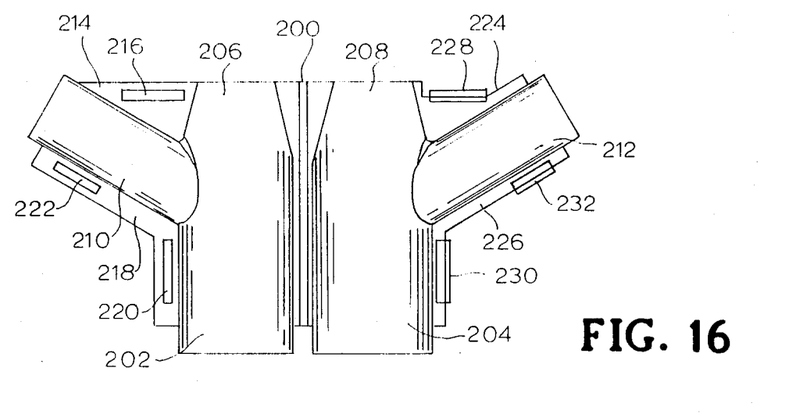
FIG. 16 is a front elevation view of a sealant applicator according to another embodiment of the invention, which may be folded along a hinge joint thereof to form an enclosing cylindrical body for enclosing a cable junction locus.

FIGS. 16–19 shown a sealant applicator according to another embodiment of the invention in various views, FIG. 16 showing an exterior view of the structure which is folded along the longitudinally extending hinge 200 to mate the respective left-hand and right-hand half-sections 202 and 204 with one another.

The structure shown in FIG. 16 is of a single piece, and may suitably be formed by casting or molding, such as injection molding, reaction injection molding (RIM), etc., using any of a wide variety of suitable materials, such as polypropylene, polyethylene, polystyrene, polyvinylchloride, polyacetals, cellulose acetate, polyamides and polyesters, acrylonitrile-butadiene-styrene copolymers. thermoplastic rubbers, etc. In contrast to some of the previously described embodiments wherein squeezing of handles is employed to open a longitudinally extending seam or lockably mating joint in a sealant applicator formed of a flexible resiliant material of construction, the embodiment shown in FIGS. 16–19 may be formed of rigid, as well as flexible resilient materials, it being necessary only that the longitudinally extending hinge 200 accommodate folding to mate the respective left-hand and right-hand sections 202 and 204, without adverse effect on the unitary character or structural integrity of the resultingly formed applicator device.

Referring again to FIG. 16, the unitary structure comprises respective semi-cylindrical portions 206 and 208, which when mated by folding of the structure form the cylindrical body of the applicator.

A semi-cylindrical fill tube portion 210 is joined to the semi-cylindrical body portion 206, and a semi-cylindrical fill tube section 212 is joined to semi-cylindrical body portion 208.

The left-hand section 202 comprises a flat web 214 between the semi-cylindrical fill tube portion 210 and semi-cylindrical body portion 206 at the upper portion thereof, containing a slot 216. A webbing 218 extends along the lower portion of the semi-cylindrical body portion 206 and the semi-cylindrical fill tube portion 210 and contains the respective slots 220 and 222.

The right-hand section 200 of the structure is similarly constructed with flat webs 224 and 226, and these webs feature associated tabs 228, 230 and 232, which lockingly engage the slots 216, 220, and 222, when the respective left hand section 202 and right hand section 204 of the structure are mated with one another.

Figure 17:
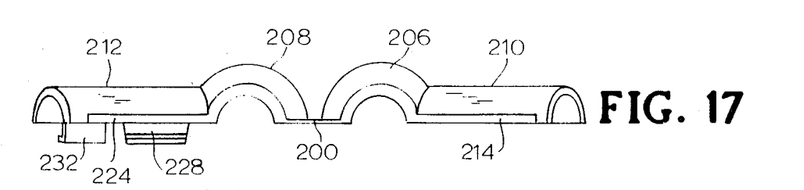
FIG. 17 is a top plan view of the sealant applicator of FIG. 18.
Figure 18:
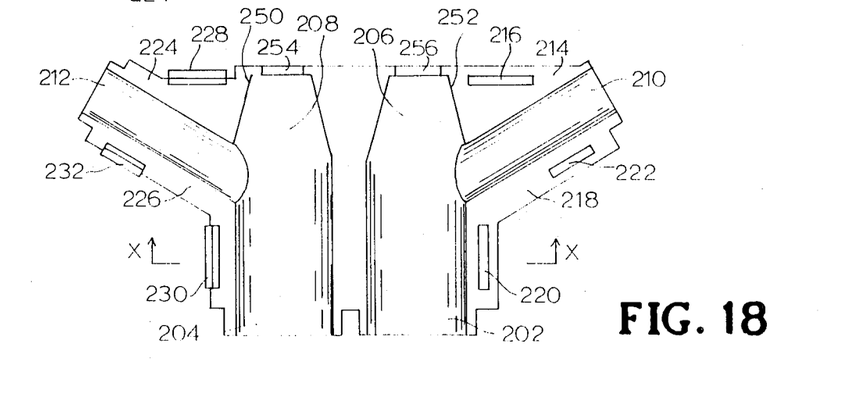
FIG. 18 is a rear elevation view of the sealant applicator of FIG. 16, showing the interior passages thereof.
Figure 19:
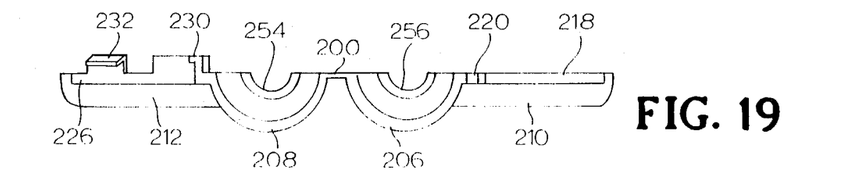
FIG. 19 is a cross-sectional view of the FIG. 18 sealant applicator, taken along line X—X thereof.

FIG. 18 shows the reverse side of the applicator-forming molded article of FIG. 16, with all elements numbered correspondingly in both drawings. FIG. 17 is a top plan view of the molded article of FIG. 18, and FIG. 19 is a sectional view of the FIG. 18 article, taken along line X—X thereof.

As shown in FIG. 18, the interior volume of the cylindrical body half-sections 204 and 202 at their respective upper ends have truncated conical-shaped passage sections 250 and 252, respectively. At the uppermost ends of these interior spaces, there are provided respective semicircular inlet passages 254 and 256, respectively. The purpose of the inlet passages is to accommodate a cable associated with the junction to be sealed, and leak-tightly fit against the outer cable surface in use.

Figure 20:
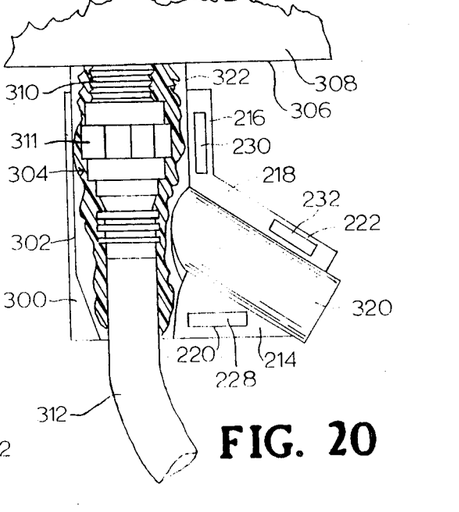
FIG. 20 is an elevational, partially sectioned view of the assembled sealant applicator of FIGS. 16-19, disposed at the junction of a coaxial cable and a CATV junction box.

FIG. 20 is an elevation view of a sealant applicator 300, of a type formed by longitudinal folding of the molded article of FIGS. 16-19 at the hinge joint 200, with the enclosure body 302 of such applicator partially broken away, to show the details of the internal structure of the junction 304 at which the applicator is disposed.

As shown, the applicator 300 is positioned with its upper end in flush abutting contact with the lower surface 306 of CATV junction box 308. Depending downwardly from the lower surface of the junction box is a threaded male coupling 310, to which the complementarily threaded female coupling 311 is joined. In such manner, the coaxial CATV cable 312 is joined to the CATV junction box 308.

The sealant applicator 300 as shown is of the type previously described in connection with FIG. 16-19, wherein respective half-sections have been lockingly mated to one another, by means of the locking tabs 230, 232, and 228 reposed respectively in slots 216, 222, and 220. When the applicator is enclosingly positioned at the cable/junction box junction 304, a suitable source of pressurized sealant is coupled to fill tube 320, and sealant under pressure is flowed through the fill tube into the interior space of the enclosure body, resulting in the filling thereof with a sealant material 322, whereby the junction 304 is sealed over its full areal extent.

Subsequent to filling the interior volume of the enclosure body surrounding the cable junction, the applicator and sealant mass together form a unitary sealing assembly, which is left in place at the junction to permanently protect the junction locus from corrosion, EMI, and RF leakage.

It is within the purview of the invention to utilize left-in-place applicators of the type shown in FIG. 20 as part of a broad-based maintenance program for retrofitting of cable television subscriber installations, wherein the applicator is molded in plastic of a specific color reflecting the date of its installation, so that the service life of various installed applicator sealing structures may be monitored for service life, as well as to identify specific installers, or for other purposes.

It will also be appreciated that while the invention has been described with reference to various embodiments thereof, as comprising unitary structures in which the fill tube, enclosure body and optionally handles, are unitarily formed as a single piece, it is within the purview of the present invention to utilize applicator structures in which the respective elements are separately formed and subsequently secured to another. Such securement may be effected by mechanical fastening means such as screws, rivets, and the like, as well as by bonding media, such as glues, adhesives, and the like, or welding, such as ultrasonic welding or solvent welding.

Further, while the invention has been described with reference to various embodiments thereof, it will be appreciated that other variations, modifications, and embodiments are possible, and accordingly all such variations, modifications, and embodiments are to be regarded as being within the spirit and scope of the invention as claimed.

What is claimed is:

1. A sealant applicator for applying a sealant material to a junction locus, comprising:

an enclosure body formed of a flexible, resilient material and comprising an interior space in which structure defining said junction locus may be reposed;

a seam extending longitudinally along the full length of the enclosure body and bounded by abuttingly matable adjacent portions of said enclosure body which are abuttingly mated with one another in the absence of lateral spreading forces thereon;

a fill tube open at one end and joined at its opposite end to the enclosure body in closed flow communication with said interior space thereof, so that sealant material introduced into the fill tube through said open end thereof under pressure flows therethrough into said interior space of the enclosure body to deposit said sealant material at said structure defining the junction locus; and finger grips disposed on an exterior surface of said enclosure body, in laterally spaced-apart relationship to said longitudinally extending seam and to each other, such that exertion of manual pressure on said finger grips causes said adjacent portions of said enclosure body bounding said seam to laterally spread apart to form an opening extending longitudinally along the full length of the enclosure body, laterally introducing said structure defining the junction locus into the interior of the enclosure body, and whereupon release of such manual pressure on said finger grips results in resilient lateral translation of said adjacent portions of said enclosure body into mating abutment with one another, to effect closure of said longitudinally extending opening.

2. A sealant applicator according to claim 1, wherein said fill tube is downwardly angularly oriented with respect to the enclosure body, so that the included angle between the respective longitudinal axes of the fill tube and the enclosure body does not exceed about 90°.

3. A sealant applicator according to claim 2, wherein said included angle is from about 20 to about 80°.

4. A sealant applicator according to claim 2, wherein said included angle is from about 30 to about 60°.

5. A sealant applicator apparatus, comprising a sealant applicator according to claim 1, coupled to source means for supplying sealant material under pressure to said fill tube for flow therethrough into said interior space of the enclosure body.

6. A sealant applicator apparatus according to claim 5, wherein said sealant material source means comprise a pressurized container containing said sealant material and having a nozzle which is secured to said fill tube, for flow of sealant material from said pressurized container into said fill tube for flow therethrough into said interior space of the enclosure body.

7. A sealant applicator according to claim 1, wherein a proximal end of the enclosure body is open, and a distal end of said closure body is provided with radially inwardly extending arcuateshaped flaps whose inner arcuate edges corporately define an opening of circular shape of lesser diameter than said interior space in said enclosure body.

8. A sealant applicator according to claim 1, wherein said enclosure body adjacent portions circumferentially lappingly mate with one another along the full longitudinal extent of said seam.

9. A sealant applicator according to claim 1, wherein said enclosure body is formed of polypropylene.

10. A sealant applicator according to claim 1, wherein said adjacent portions of said enclosure body define tongue-and-groove surfaces which are abuttingly matable with one another.

11. A single piece sealant applicator for applying a sealant material to a junction locus, comprising:
- a hinged unitary structure comprising a longitudinally extending hinge defining symmetrical half-sections of the structure on either side of the hinge, the structure being foldable along the longitudinally extending hinge to mate the half-sections of the structure with one another when folded;
- wherein each half-section comprises:
  - a longitudinally extending enclosure body half-section having a lateral opening at each end thereof at an associated edge of the unitary structure half-section;
  - a fill tube half-section joined at a first end to said enclosure body half-section and laterally outwardly extending therefrom to a second, open end; and
  - web members extending outwardly from peripheral surfaces of said enclosure body and fill tube half-sections, and comprising mechanically lockable fastening means on said web members which are lockingly matable with one another when the unitary structure is folded about said hinge and the half-sections are mated with one another.

12. A sealant applicator according to claim 11, wherein the enclosure body and fill tube half-sections are semi-cylindrical in shape.

13. A sealant applicator according to claim 11, which is devoid of any sealant material in said enclosure body and fill tube half-sections prior to mating of the unitary structure half-sections with one another.

14. A sealant applicator according to claim 11, formed of a thermoplastic material.

15. A cable television junction box assembly, comprising:
- a cable television junction box;
- a coaxial cable mechanically joined to said cable television junction box to form a cable junction therewith; and
- a sealant applicator enclosingly disposed at said junction, said sealant applicator comprising:
  - an enclosure body formed of a flexible, resilient material and comprising an interior space in which said junction is reposed with said interior space containing said junction being filled with a sealant material;
  - a seam extending longitudinally along the full length of the enclosure body and bounded by abuttingly matable adjacent portions of said enclosure body which are abuttingly mated with one another in the absence of lateral spreading forces thereon;
  - a fill tube open at one end and joined at its opposite end to the enclosure body in closed flow communication with said interior space thereof, whereby said sealant material has been introduced into the fill tube through said open end thereof under pressure and flowed therethrough into said interior space of the enclosure body to deposit said sealant material at said junction; and
  - finger grips disposed on an exterior surface of said enclosure body, in laterally spaced-apart relationship to said longitudinally extending seam and to each other, such that exertion of manual pressure on said finger grips causes said adjacent portions of said enclosure body bounding said seam to laterally spread apart to form an opening extending longitudinally along the full length of the enclosure body, whereby said junction has been laterally introduced into the interior of the enclosure body, and upon release of such manual pressure on said finger grips has resulted in resilient lateral translation of said adjacent portions of said enclosure body into mating abutment with one another, to effect closure of said longitudinally extending opening.

16. A cable television junction box assembly, comprising:
- a cable television junction box;
- a coaxial cable mechanically joined to said cable junction box to form a cable junction therewith; and
- a sealant applicator enclosingly disposed at said junction, said sealant applicator comprising:
  - a hinged unitary structure comprising a longitudinally extending hinge defining symmetrical half-sections of the structure on either side of the hinge, the structure being folded along the longitudinally extending hinge to mate the half-sections of the structure with one another to form an interior space therein, with said interior space being filled with a sealant material;
- wherein each half-section comprises:
  - a longitudinally extending enclosure body half-section having a lateral opening at each end thereof at an associated edge of the unitary structure half-section;
  - a fill tube half-section joined at a first end to said enclosure body half-section and laterally outwardly extending therefrom to a second, open end; and
  - web members extending outwardly from peripheral surfaces of said enclosure body and fill tube halfsections, and comprising mechanically lockable fastening means on said web members which are lockingly matable with one another when the unitary structure is folded about said hinge and the half-sections are mated with one another.

17. A sealant applicator for applying a sealant material to a junction locus, comprising:
- an elongate enclosure body (i) having an interior space in which structure defining said junction locus may be reposed, (ii) comprising first and second elongate sections longitudinally slidingly matable with one another along corresponding lateral extremities thereof, said first section having lateral extremities with longitudinally extending grooves therein, and said second section having lateral extremities with enlarged edges which are slidingly received in corresponding said grooves of said first section, and (iii) of a circumferentially continuous character about said interior space;

a fill tube, open at one end and joined at its opposite end to one of said elongate sections of said enclosure body in closed flow communication with said interior space of the enclosure body, so that sealant material introduced into the fill tube through said open end thereof under pressure flows therethrough into said interior space of the enclosure body to deposit said sealant material at said structure defining the junction locus; and a manually graspable handle joined to one of said enclosure body elongate sections, for manually effecting longitudinal translation of said sections relative to one another, for separation thereof.

18. A sealant applicator for applying a sealant material to a junction locus, comprising:

an enclosure body having an interior space in which structure defining said junction locus may be reposed, the enclosure body comprising opposed enclosure body half-sections each provided on its longitudinal edge surfaces with complementarily configured mating structure, whereby the respective half-sections may be lockingly mated with one another;

wherein the respective half-sections are hingedly joined to one another at their lower abutting extremities by a flexible resilient hinge permitting the half-sections to be selectively disengaged from one another, to admit said structure defining the junction locus into said interior space of the enclosure body; and a fill tube open at one end and joined at its opposite end to one of said half-sections, in closed flow communication with said interior space of the enclosure body, so that sealant material introduced into the fill tube through said open end thereof under pressure flows therethrough into said interior space of the enclosure body to deposit said sealant material at said structure defining the junction locus, when said junction locus-defining structure is resposed in said interior space.

19. A sealant applicator for applying a sealant material to a junction locus, comprising:

a cylindrical enclosure body having an interior space in which structure defining said junction locus may be reposed;

a seam extending longitudinally along the full length of the enclosure body and bounded by adjacent portions of said enclosure body which are abuttingly matable with one another, each of said abuttingly matable portions comprising tongue and groove surfaces which interfit when said portions are abuttingly mated;

said enclosure body having a reduced thickness region extending longitudinally along the full length of the enclosure body diametrically opposite the seam, the reduced thickness region being sufficiently flexible to permit the adjacent portions of the enclosure body bounding said seam to be disengaged and laterally translated away from one another to form a longitudinally extending opening into which said structure defining said junction locus may be laterally introduced so as to be enclosed by the enclosure body when said adjacent portions thereof are mated with one another; and a fill tube open at one end and joined at its opposite end to the enclosure body, in closed flow communication with said interior space thereof, so that sealant material introduced into the fill tube through said open end thereof under pressure flows therethrough into said interior space to deposit said sealant material at said structure defining the junction locus.

* * * * *

UNITED STATES PATENT AND TRADEMARK OFFICE
CERTIFICATE OF CORRECTION

PATENT NO. : 4,867,210

DATED : September 19, 1989

INVENTOR(S) : Robert E. Montenieri, Sr.

It is certified that error appears in the above-identified patent and that said Letters Patent is hereby corrected as shown below:

Column 5, line 38, change "interruptor)devices" to --interruptor) devices--.

Column 5, line 48, change "latent!y" to --latently--.

Column 16, line 57, change "halfsections" to --half-sections--.

Signed and Sealed this

Eighth Day of January, 1991

Attest:

HARRY F. MANBECK, JR.

*Attesting Officer*   *Commissioner of Patents and Trademarks*